(12) United States Patent
Nishimori et al.

(10) Patent No.: US 10,008,591 B2
(45) Date of Patent: Jun. 26, 2018

(54) SEMICONDUCTOR DEVICE, FABRICATION METHOD FOR SEMICONDUCTOR DEVICE, POWER SUPPLY APPARATUS AND HIGH-FREQUENCY AMPLIFIER

(71) Applicant: FUJITSU LIMITED, Kawasaki-shi, Kanagawa (JP)

(72) Inventors: Masato Nishimori, Atsugi (JP); Tatsuya Hirose, Yokohama (JP); Atsushi Yamada, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days. days.

(21) Appl. No.: 15/683,860

(22) Filed: Aug. 23, 2017

(65) Prior Publication Data

US 2017/0352755 A1    Dec. 7, 2017

Related U.S. Application Data

(62) Division of application No. 15/043,720, filed on Feb. 15, 2016.

(30) Foreign Application Priority Data

Mar. 5, 2015    (JP) ................. 2015-043667

(51) Int. Cl.
 *H01L 21/00* (2006.01)
 *H01L 29/778* (2006.01)
 (Continued)

(52) U.S. Cl.
 CPC ...... *H01L 29/7787* (2013.01); *H01L 21/3245* (2013.01); *H01L 21/764* (2013.01); *H01L 29/0649* (2013.01); *H01L 29/0657* (2013.01); *H01L 29/1075* (2013.01); *H01L 29/41766* (2013.01); *H01L 29/66462* (2013.01); *H01L 29/7786* (2013.01); *H01L 23/3171* (2013.01); *H01L 29/2003* (2013.01);
 (Continued)

(58) Field of Classification Search
 CPC .......... H01L 29/2003; H01L 29/66431; H01L 29/66462; H01L 29/778
 USPC .... 257/192, 194, 196, E29.247; 438/47, 191
 See application file for complete search history.

(56) References Cited

U.S. PATENT DOCUMENTS 8,441,105 B2    5/2013   Sato et al.
9,306,051 B2    4/2016   Miura et al.
 (Continued)

FOREIGN PATENT DOCUMENTS

JP    2008-277440    11/2008
JP    2009-212183    9/2009

OTHER PUBLICATIONS

USPTO, (TRAN) Non-Final Rejection, dated May 18, 2017, in parent U.S. Appl. No. 15/043,720 [pending].
 (Continued)

*Primary Examiner* — Tan N Tran
(74) *Attorney, Agent, or Firm* — Fujitsu Patent Center

(57) ABSTRACT

A semiconductor device is configured including a p-type back barrier layer provided over a substrate and formed from a p-type nitride semiconductor in which Mg or Zn is doped, a nitride semiconductor stacked structure provided over the p-type back barrier layer, the nitride semiconductor stacked structure including an electron transit layer and an electron supply layer, a source electrode, a drain electrode and a gate electrode provided over the nitride semiconductor stacked structure, and a groove extending to the p-type back barrier layer.

7 Claims, 14 Drawing Sheets

(51) Int. Cl.
    *H01L 29/10*     (2006.01)
    *H01L 29/06*     (2006.01)
    *H01L 29/417*     (2006.01)
    *H01L 21/764*     (2006.01)
    *H01L 29/66*     (2006.01)
    *H01L 21/324*     (2006.01)
    *H01L 23/31*     (2006.01)
    *H01L 29/20*     (2006.01)
    *H01L 29/207*     (2006.01)

(52) U.S. Cl.
    CPC ...... *H01L 29/207* (2013.01); *H01L 29/41758* (2013.01); *H01L 2224/0603* (2013.01); *H01L 2224/48247* (2013.01); *H01L 2224/48257* (2013.01); *H01L 2224/4903* (2013.01)

(56) References Cited

U.S. PATENT DOCUMENTS

| | | |
|---|---|---|
| 2008/0210989 A1 | 9/2008 | Naito |
| 2012/0139630 A1 | 6/2012 | Ozaki et al. |
| 2016/0043219 A1 | 2/2016 | Liu et al. |

OTHER PUBLICATIONS

USPTO, (TRAN) Final Rejection, dated Feb. 10, 2017, in parent U.S. Appl. No. 15/043,720 [pending].

USPTO, (TRAN) Non-Final Rejection, dated Oct. 20, 2016, in parent U.S. Appl. No. 15/043,720 [pending].

USPTO, (TRAN) Restriction Requirement, dated Jul. 26, 2016, in parent U.S. Appl. No. 15/043,720 [pending].

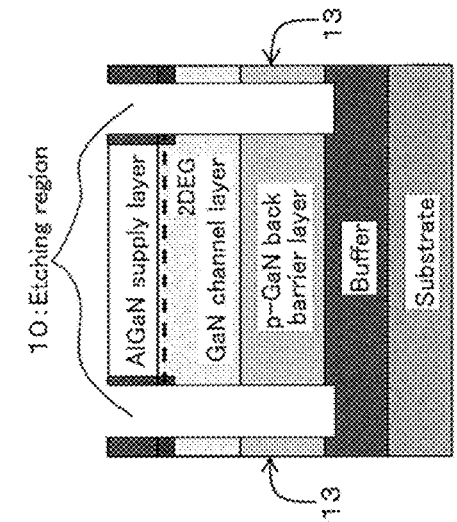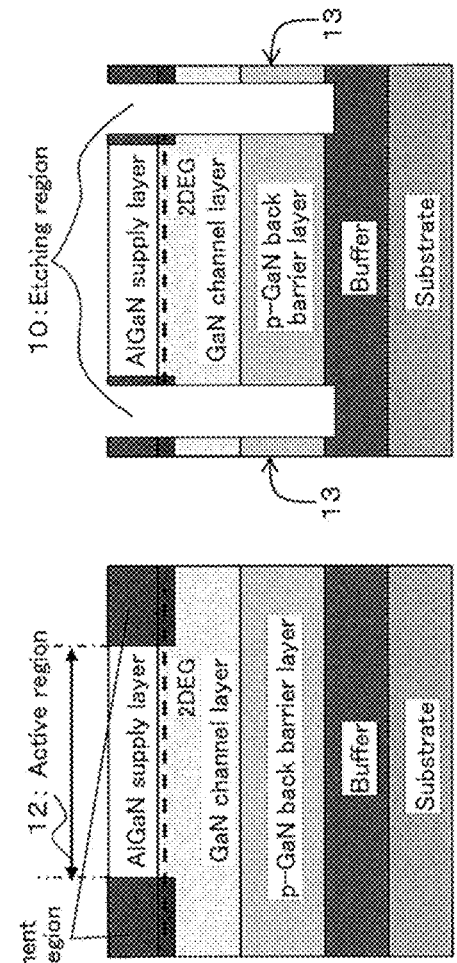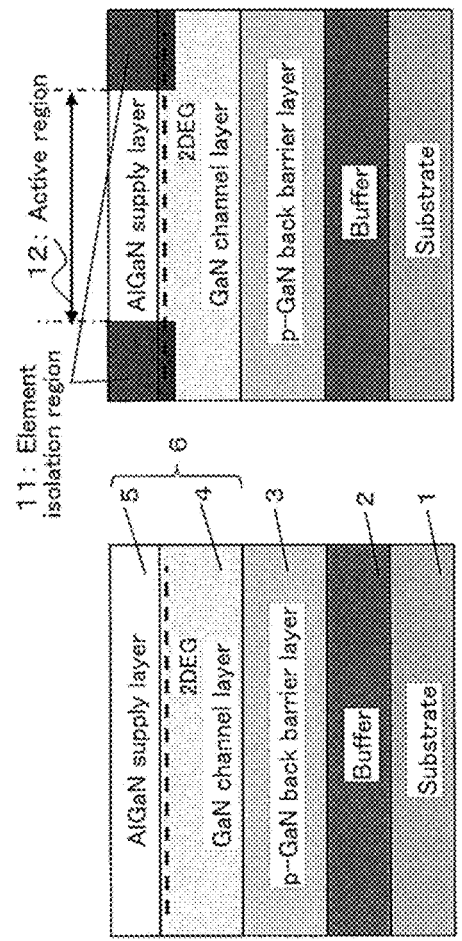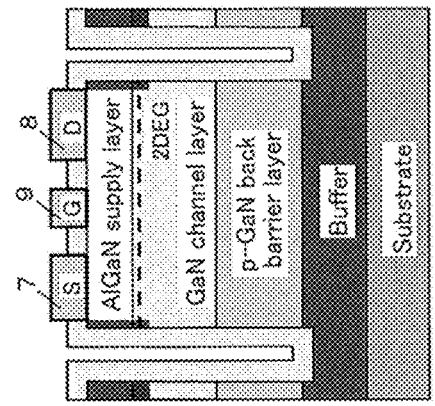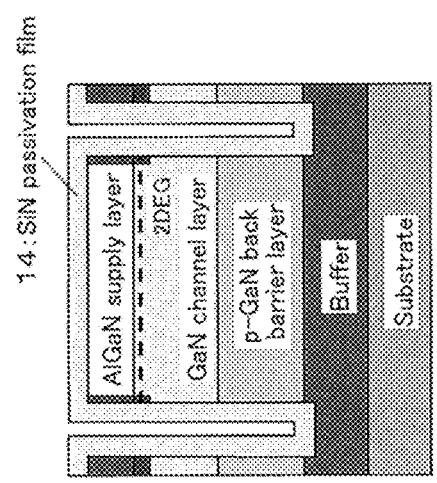

p-GaN back barrier structure

SEMICONDUCTOR DEVICE, FABRICATION METHOD FOR SEMICONDUCTOR DEVICE, POWER SUPPLY APPARATUS AND HIGH-FREQUENCY AMPLIFIER

CROSS-REFERENCE TO RELATED APPLICATION

This application is a divisional of application Ser. No. 15/043,720, filed Feb. 15, 2016, which is based upon and claims the benefit of priority of the prior Japanese Patent Application No. 2015-043667, filed on Mar. 5, 2015, the entire contents of which are incorporated herein by reference.

FIELD

The embodiments discussed herein are related to a semiconductor device, a fabrication method for a semiconductor device, a power supply apparatus and a high-frequency amplifier.

BACKGROUND

Since a nitride semiconductor has a characteristic in high saturation electron velocity, wide band gap and so forth, application of the nitride semiconductor to a semiconductor device of a high withstand voltage and high output power is examined.

For example, the band gap of GaN that is a nitride semiconductor is approximately 3.4 eV, and is greater than the band gap of Si (approximately 1.1 eV) and the band gap of GaAs (approximately 1.4 eV) and has a high breakdown field strength. Therefore, GaN is a very prospective material as a material for a semiconductor device for achieving high voltage action and high output power.

As a semiconductor device for which a nitride semiconductor is used, a field-effect transistor, particularly, a high electron mobility transistor (HEMT), is available.

For example, as a GaN-based HEMT (GaN-HEMT), an AlGaN/GaN-HEMT for which GaN and AlGaN are used as an electron transit layer (channel layer) and an electron supply layer, respectively, is available. In the AlGaN/GaN-HEMT, a distortion arising from a lattice constant difference between GaN and AlGaN occurs with AlGaN, and high-concentration two-dimensional electron gas (2DEG) is obtained by piezoelectric polarization and a spontaneous polarization difference of AlGaN caused by the distortion. Therefore, a high-withstand-voltage and high-output power device can be implemented by the AlGaN/GaN-HEMT.

SUMMARY

According to an aspect of the embodiment, a semiconductor device comprises a p-type back barrier layer provided over a substrate and formed from a p-type nitride semiconductor in which Mg or Zn is doped, a nitride semiconductor stacked structure provided over the p-type back barrier layer, the nitride semiconductor stacked structure including an electron transit layer and an electron supply layer, a source electrode, a drain electrode and a gate electrode provided over the nitride semiconductor stacked structure, and a groove extending to the p-type back barrier layer.

According to an aspect of the embodiment, a power supply apparatus comprises a transistor, wherein the transistor includes a p-type back barrier layer provided over a substrate and formed from a p-type nitride semiconductor in which Mg or Zn is doped, a nitride semiconductor stacked structure provided over the p-type back barrier layer, the nitride semiconductor stacked structure including an electron transit layer and an electron supply layer, a source electrode, a drain electrode and a gate electrode provided over the nitride semiconductor stacked structure, and a groove extending to the p-type back barrier layer.

According to an aspect of the embodiment, a high-frequency amplifier comprises an amplifier to amplify an input signal, the amplifier to include a transistor, the transistor including a p-type back barrier layer provided over a substrate and formed from a p-type nitride semiconductor in which Mg or Zn is doped, a nitride semiconductor stacked structure provided over the p-type back barrier layer, the nitride semiconductor stacked structure including an electron transit layer and an electron supply layer, a source electrode, a drain electrode and a gate electrode provided over the nitride semiconductor stacked structure, and a groove extending to the p-type back barrier layer.

According to an aspect of the embodiment, a fabrication method for a semiconductor device comprises forming a p-type back barrier layer from a p-type nitride semiconductor in which Mg or Zn is doped over a substrate, forming a nitride semiconductor stacked structure including an electron transit layer and an electron supply layer over the p-type back barrier layer, forming a source electrode, a drain electrode and a gate electrode over the nitride semiconductor stacked structure, forming a groove extending to the p-type back barrier layer, and performing an anneal process for desorbing hydrogen from the p-type back barrier layer through the groove to activate the p-type back barrier layer.

The object and advantages of the invention will be realized and attained by means of the elements and combinations particularly pointed out in the claims. It is to be understood that both the foregoing general description and the following detailed description are exemplary and explanatory and are not restrictive of the invention.

BRIEF DESCRIPTION OF DRAWINGS

FIGS. 2A to 2E are schematic sectional views illustrating a fabrication method for a semiconductor device according to the first embodiment;

FIGS. 3A and 3B are schematic views depicting a configuration of a semiconductor device according to a first modification to the first embodiment, wherein FIG. 3A is a sectional view and FIG. 3B is a top plan view;

FIGS. 10A and 10B are views illustrating a subject of the present invention, wherein FIG. 10A is a view depicting a relationship between a position in a thicknesswise direction and a potential of a normal AlGaN/GaN-HEMT (normal structure) and an AlGaN/GaN-HEMT having a p-GaN back barrier layer (p-GaN back barrier structure) and FIG. 10B is a view depicting a stacked structure of the normal structure and the p-GaN back barrier structure in an associated relationship with the thicknesswise direction position of FIG. 10A;

DESCRIPTION OF EMBODIMENTS

Figure 9:
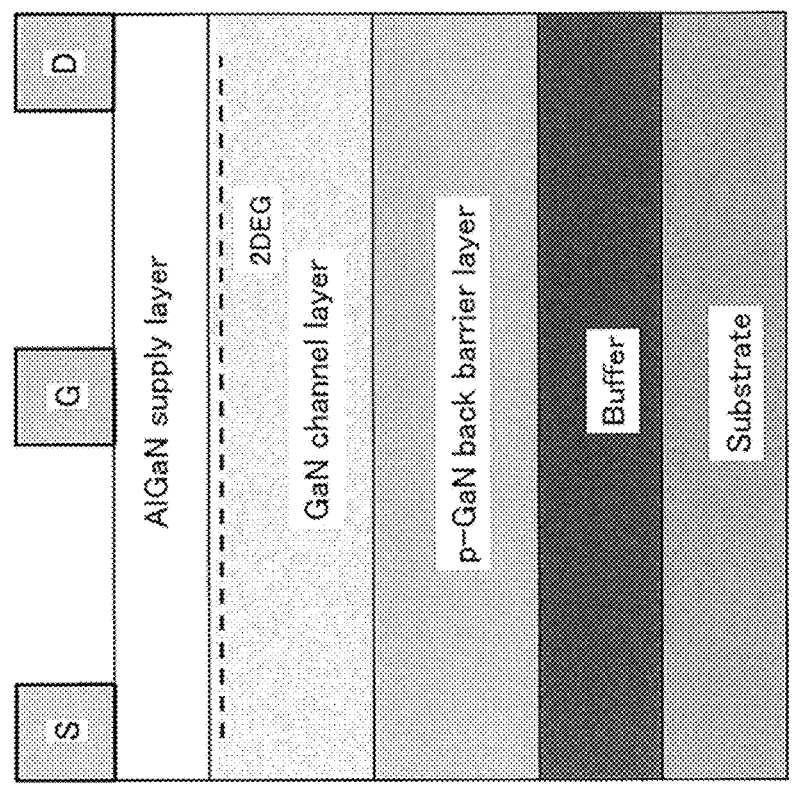
FIG. 9 is a view illustrating a subject of the present invention and is a schematic sectional view depicting a configuration of an AlGaN/GaN-HEMT having a p-GaN back barrier layer.
Figure 10A:
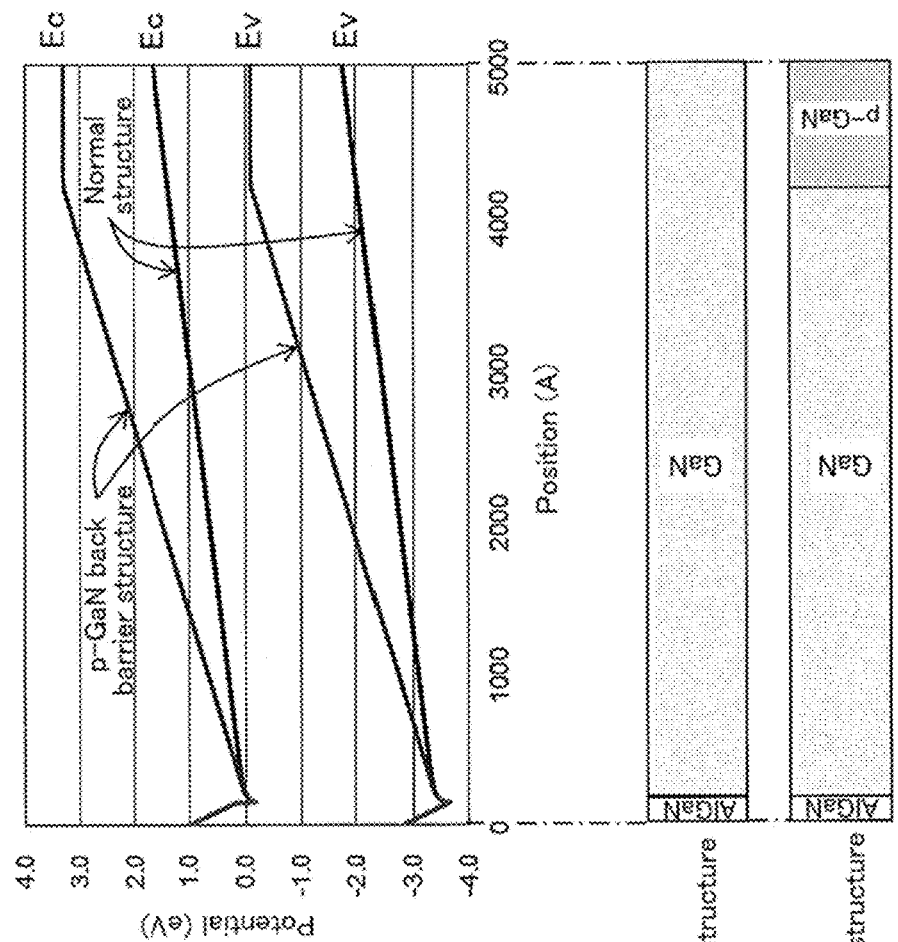
Figure 10B:
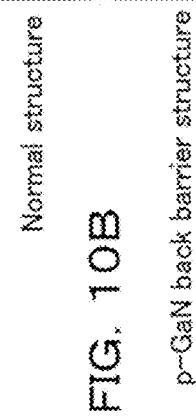

Incidentally, in order to suppress leak current flowing between a source electrode and a drain electrode where the gate length is short, it seems a possible idea to provide a p-GaN back barrier layer under a GaN channel layer, for example, as depicted in FIG. 9. By providing the p-GaN back barrier layer, the potential under the GaN channel layer can be increased as depicted in FIGS. 10A and 10B, and therefore, the leak current flowing between the source electrode and the drain electrode can be suppressed.

If Mg operating as an accepter is coupled with H existing in crystal in the p-GaN back barrier layer, then positive holes cannot be generated. Therefore, where the p-GaN back barrier layer is provided, an activation anneal process for desorbing H thereby to cause Mg to function as an acceptor to activate the p-GaN back barrier layer is performed.

However, in the AlGaN/GaN-HEMT having the p-GaN back barrier layer, a GaN channel layer and an AlGaN electron supply layer exist over the p-GaN back barrier layer. Since positive fixed charge is generated on an interface between the AlGaN electron supply layer and the GaN channel layer, an internal electric field is generated between the p-GaN back barrier layer and the GaN channel layer. Therefore, it has been found that desorption of H from the surface of the p-GaN back barrier layer is inhibited and desorption of H from a side wall on which the p-GaN back barrier layer is exposed, namely, activation, advances. Further, since the dispersion speed of H is low, it has been recognized that H is desorbed little at a location spaced far from the side wall and it is difficult to activate the entire p-GaN back barrier layer with certainty.

It is to be noted that, while a subject where the p-GaN back barrier layer is provided in the AlGaN/GaN-HEMT is described here, there is a similar subject also in the case in which a p-type back barrier layer formed from a p-type nitride semiconductor in which Mg or Zn is doped is provided in a semiconductor device that includes a nitride semiconductor stacked structure including an electron transit layer and an electron supply layer.

Therefore, where a p-type back barrier layer formed from a p-type nitride semiconductor in which Mg or Zn is doped is provided in a semiconductor device that includes a nitride semiconductor stacked structure including an electron transit layer and an electron supply layer, it is demanded to activate the entire p-type back barrier layer.

In the following, a semiconductor device, a fabrication method for a semiconductor device, a power supply apparatus and a high-frequency amplifier according to embodiments of the present invention are described with reference to the drawings.

First Embodiment

First, a semiconductor device and a fabrication method for a semiconductor device according to a first embodiment are described with reference to FIGS. 1 to 8E.

The semiconductor device according to the present embodiment is a compound semiconductor device for which a compound semiconductor such as, for example, a nitride semiconductor is used, and is a semiconductor device that includes a nitride semiconductor stacked structure (HEMT structure) including an electron transit layer and an electron supply layer.

Here, the present embodiment is described taking, as an example, an AlGaN/GaN-HEMT in which GaN, AlGaN and p-GaN that is a p-type nitride semiconductor are used for an electron transit layer (channel layer), an electron supply layer and a p-type back barrier layer, respectively.

Figure 1:
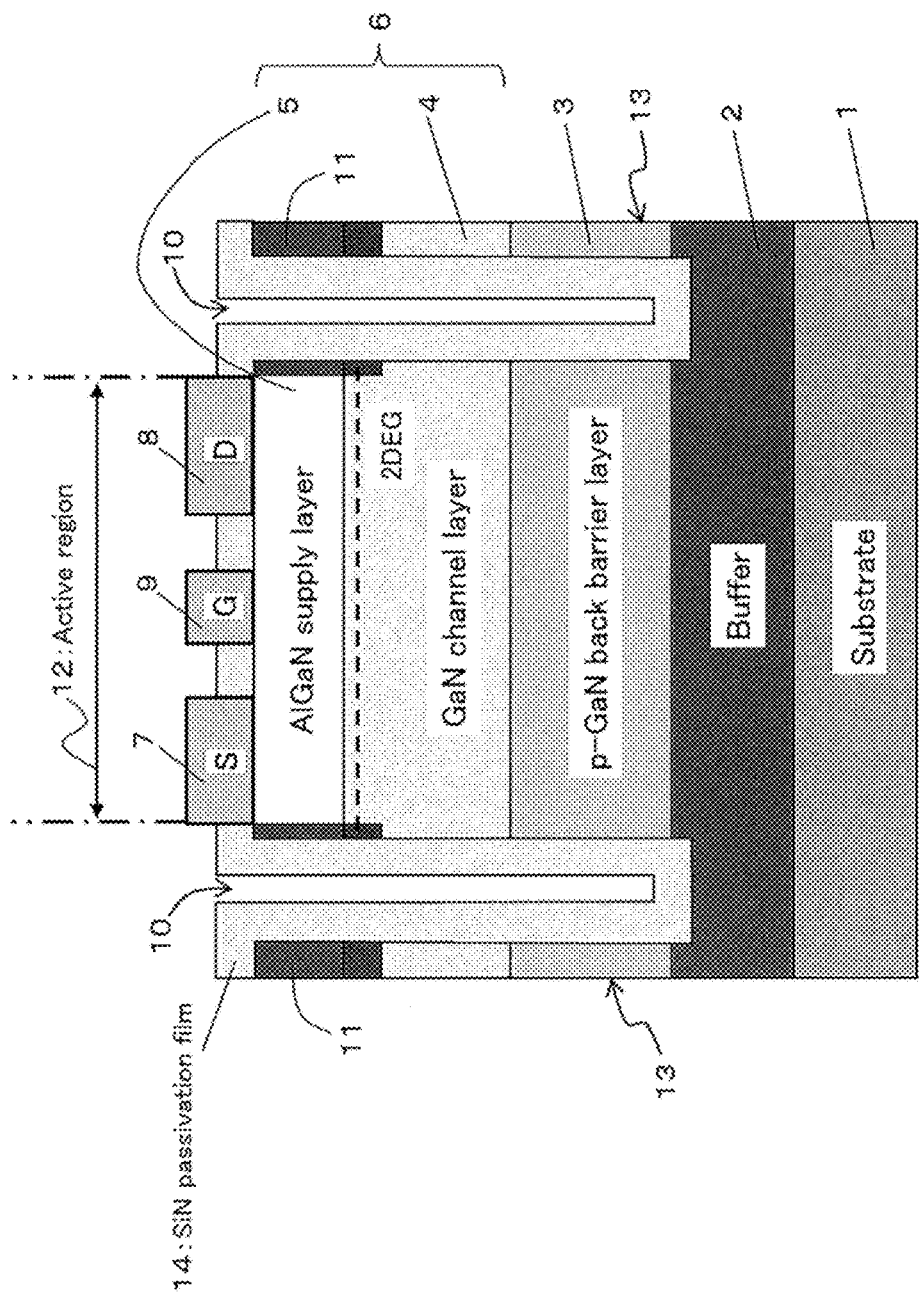
FIG. 1 is a schematic sectional view depicting a configuration of a semiconductor device according to a first embodiment.

For example, as depicted in FIG. 1, the present semiconductor device includes a nitride semiconductor stacked structure 6 including a GaN channel layer 4 and an AlGaN electron supply layer 5 provided over a substrate 1.

In this case, as indicated by a broken line in FIG. 1, two-dimensional electron gas (2DEG) is generated in the proximity of an interface between the GaN channel layer 4 and the AlGaN electron supply layer 5.

Here, the substrate 1 is, for example, a SiC substrate. It is to be noted that one of a Si substrate, a SiC substrate, a sapphire substrate, a GaO substrate, an AlN substrate and a GaN substrate may be used for the substrate 1.

Further, the present semiconductor device includes a p-GaN back barrier layer 3 formed from p-GaN in which Mg is doped and provided under the GaN channel layer 4.

In this manner, the present semiconductor device includes the p-GaN back barrier layer 3 provided over the substrate 1 and further includes the nitride semiconductor stacked structure 6 including the GaN channel layer 4 and AlGaN electron supply layer 5 and provided over the p-GaN back barrier layer 3. Here, a structure is formed in which a buffer layer 2, the p-GaN back barrier layer 3, the GaN channel layer 4 and the AlGaN electron supply layer 5 are stacked on the substrate 1.

A source electrode 7, a drain electrode 8 and a gate electrode 9 are provided over the nitride semiconductor stacked structure 6.

Particularly, in the present embodiment, a groove 10 is provided so as to extend to the p-GaN back barrier layer 3. In particular, the groove 10 extends from the surface of the nitride semiconductor stacked structure 6 to the p-GaN back barrier layer 3. It is to be noted that, since the groove 10 is formed by etching as hereinafter described, the groove 10 is an etching region. Further, as hereinafter described, the groove 10 is used to desorb hydrogen (H) from the p-GaN back barrier layer 3. Therefore, the groove 10 is referred to sometimes as hydrogen desorption groove.

Here, the groove 10 extends to the lower face of the p-GaN back barrier layer 3, namely, to the upper face of the buffer layer 2. It is to be noted that the groove 10 is not limited to this, and the groove 10 may extend to the upper face of the p-GaN back barrier layer 3, namely, to the lower face of the GaN channel layer 4 or may extend to an intermediate position of the p-GaN back barrier layer 3 in a thicknesswise direction.

Further, the groove 10 here is provided in an element isolation region 11. In particular, the groove 10 is provided in the proximity of an active region 12, namely, in the element isolation region 11 in the proximity of the active region 12. It is to be noted that the element isolation region 11 is provided around the active region 12, and is positioned at the inner side than a side wall 13 of a wafer or a chip.

Further, since the groove 10 here is formed by performing etching to the p-GaN back barrier layer 3 as hereinafter described, the entire GaN channel layer 4 can be isolated physically. Therefore, as hereinafter described, the element isolation performance can be enhanced in comparison with an alternative case in which ion implantation is only performed to the proximity of the AlGaN/GaN interface to form the element isolation region 11.

Further, here, also a passivation film (here, SiN film) 14 for covering the surface is provided, and also the surface of the groove 10 is covered with the passivation film 14.

Incidentally, such a groove 10 that extends to the p-GaN back barrier layer 3 as described above is provided from the reason described in the following.

For example, in an AlGaN/GaN-HEMT for a high frequency application, the gate length is set short in order to increase the operation frequency. However, in this case, a short channel effect occurs and leak current flows between the source electrode and the drain electrode.

In order to suppress such leak current as just described, it seems a possible idea to provide a p-GaN back barrier layer under a GaN channel layer (for example, refer to FIG. 9). Since, by providing the p-GaN back barrier layer, the potential under the GaN channel layer can be raised (for example, refer to FIGS. 10A and 10B), leak current flowing between the source electrode and the drain electrode can be suppressed.

If Mg acting as an acceptor in such a p-GaN back barrier layer as described above is coupled with H existing in crystal, then positive holes cannot be generated. Therefore, where the p-GaN back barrier layer is provided, an activation anneal process for desorbing H and causing Mg to function as an acceptor and activate the p-GaN back barrier layer is performed.

However, in the AlGaN/GaN-HEMT having the p-GaN back barrier layer, the GaN channel layer and the AlGaN electron supply layer exist on the p-GaN back barrier layer. Thus, since positive fixed charge is generated on the interface between the AlGaN electron supply layer and the GaN channel layer, an internal electric field is generated between the p-GaN back barrier layer and the GaN channel layer. Therefore, it has been turned out that desorption of H from the surface of the p-GaN back barrier layer is inhibited and desorption of H from the side wall on which the p-GaN back barrier layer is exposed, namely, activation, is advanced. Further, since the dispersion speed of H is low, it has been turned out that H is little desorbed at a location spaced far from the side wall and it is difficult to activate the entire p-GaN back barrier layer with certainty.

Here, as the activation anneal process, an anneal process at 700° C. was performed for 10 minutes, for example, in an $O_2$ atmosphere for the AlGaN/GaN-HEMI including the p-GaN back barrier layer, and the remaining H concentration in the p-GaN back barrier layer was measured. As a result, such a result as depicted in FIG. 11 was obtained.

Figure 11:
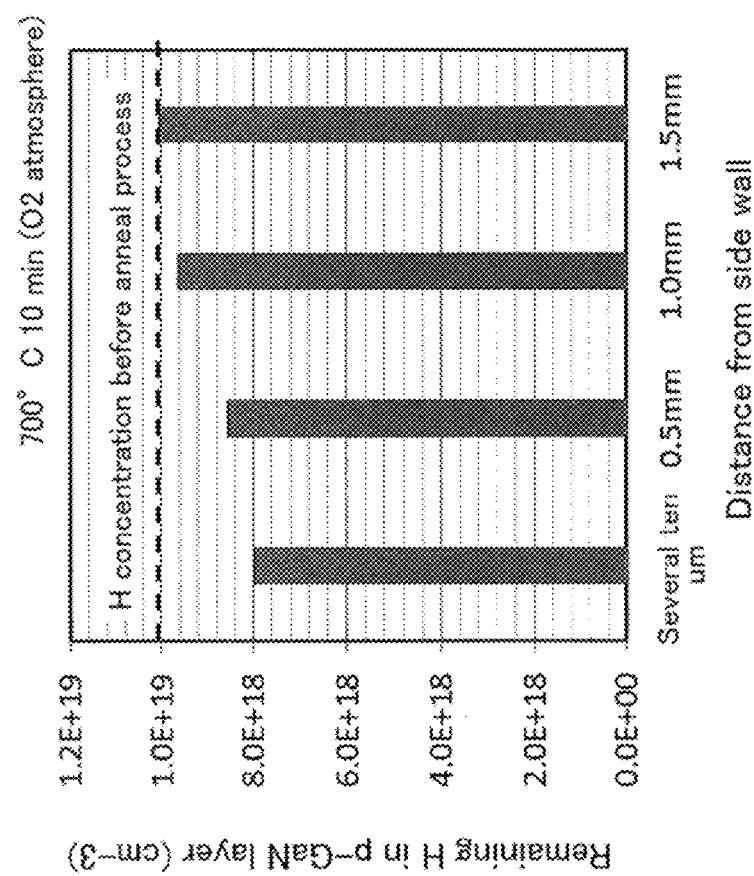
FIG. 11 is a view illustrating a subject of the present invention and is a view depicting a result when an activation anneal process is performed for an AlGaN/GaN-HEMT having a p-GaN back barrier layer and a remaining H concentration in the p-GaN back barrier layer is measured.

It has been turned out that H can little be desorbed at a distance of 1 mm or more from the side wall as depicted in FIG. 11.

For example, even if the activation anneal process is performed for a chip having a size of several millimeters square such as an MMIC, the p-GaN back barrier layer is little activated at a central location of the chip.

Therefore, by providing such a groove 10 extending to the p-GaN back barrier layer 3 as described above and performing the activation anneal process as hereinafter described, the entire p-GaN back barrier layer can be activated (made to p-type) with certainty. Therefore, such a groove 10 extending to the p-GaN back barrier layer 3 as described above is provided in the semiconductor device fabricated in such a manner as hereinafter described.

In this manner, by providing such a groove 10 extending to the p-GaN back barrier layer 3 as described above, desorption of H can be facilitated and the entire p-GaN back barrier layer 3 can be activated with certainty in the AlGaN/GaN-HEMT in which the GaN channel layer 4 and the AlGaN electron supply layer 5 exist on the p-GaN back barrier layer 3. Further, by the p-GaN back barrier layer 3 that is provided under the GaN channel layer 4 and activated entirely, leak current flowing between the source electrode 7 and the drain electrode 8 where the gate length is short can be suppressed. In particular, desorption of H can be facilitated and the p-GaN back barrier layer 3 can be uniformly activated in a plane of a wafer or a chip, and the AlGaN/GaN-HEMT having low leak current can be implemented. Further, also the p-GaN back barrier layer 3 at a central portion that is a location spaced far from the side wall 13 of a chip having a size of several millimeters square such as, for example, an MMIC can be activated with certainty.

Now, a fabrication method for a semiconductor device according to the present embodiment is described with reference to FIGS. 2A to 2E.

First, as depicted in FIG. 2A, an AlN nucleation layer as the buffer layer 2 is grown on a SiC substrate 1 as a growth substrate so as to obtain a thickness of, for example, approximately 200 nm, for example, by a MOCVD method.

Then, a p-GaN back barrier layer 3 in which Mg as a p-type impurity is doped with a concentration, for example, of approximately $5 \times 10^{19}$ cm$^{-3}$ is grown, for example, by a thickness of approximately 300 nm.

Then, a GaN channel layer 4 is grown, for example, by a thickness of approximately 300 nm.

Then, an AlGaN electron supply layer 5 formed, for example, from $Al_{0.2}Ga_{0.8}N$ is grown, for example, by a thickness of approximately 20 nm.

Here, the growth temperature may be, for example, approximately 100° C., and the pressure maybe, for example, 50 mbar. Further, as source gas, for example, mixture gas of trimethyl aluminum gas, trimethyl gallium gas and ammonia gas may be used.

It is to be noted that, while the present embodiment is described taking, as an example, a case in which a MOCVD method is used as a crystal growth method for nitride semiconductor crystal, the embodiment is not limited to this and some other crystal growth method such as, for example, an MBE method can be used.

The AlN nucleation layer as the buffer layer 2, p-GaN back barrier layer 3, GaN channel layer 4 and AlGaN electron supply layer 5 are stacked on the SiC substrate 1 in this manner. Consequently, the nitride semiconductor stacked structure 6 including the GaN channel layer 4 and AlGaN electron supply layer 5 is formed over the p-GaN back barrier layer 3.

Then, as depicted in FIG. 2B, an element isolation region 11 is formed by performing, for example, ion implantation of Ar. Here, the ion implantation of Ar for formation of the element isolation region 11 may be performed with energy of such a degree that ions reach the 2DEG region of the interface between the AlGaN electron supply layer 5 and the GaN channel layer 4.

Then, as depicted in FIG. 2C, a groove (etching region) 10 is formed in the element isolation region 11 in the proximity of the active region 12 so as to extend from the surface of the nitride semiconductor stacked structure 6, namely, from the surface of the AlGaN electron supply layer 5, to the p-GaN back barrier layer 3, for example, by etching using chlorine-based gas.

After the groove 10 extending to the p-GaN back barrier layer 3 is formed in this manner, as the activation anneal process for desorbing H from the p-GaN back barrier layer 3 to activate the p-GaN back barrier layer 3, an anneal process is performed at approximately 750° C. for approximately 10 minutes, for example, in a nitrogen atmosphere. In this case, since the groove 10 extending to the p-GaN back barrier layer 3 is formed, H (hydrogen) can be desorbed from the p-GaN back barrier layer 3 through the groove 10. In particular, H (hydrogen) can be desorbed not only through the side wall 13 of the wafer but also through the groove 10 provided at the inner side than the side wall 13. Consequently, the entire p-GaN back barrier layer 3 can be activated with certainty also including a location spaced far from the side wall 13 of the wafer. Further, by the p-GaN back barrier layer 3 provided under the GaN channel layer 4 and activated entirely, leak current flowing between the source electrode 7 and the drain electrode 8 can be suppressed also where the gate length is short.

Thereafter, as depicted in FIG. 2D, a SiN film having a thickness of, for example, approximately 50 nm is formed as a passivation film 14 for covering the surface, for example, by a CVD method. Here, with the SiN film as the passivation film 14, also the surface of the groove 10 extending to the p-GaN back barrier layer 3, namely, the surface of the groove 10 used to desorb H from the p-GaN back barrier layer 3, is covered.

Finally, as depicted in FIG. 2E, after the SiN film 14 at the locations at which electrodes are to be formed is removed by etching using, for example, fluorine-based gas, a source electrode 7, a drain electrode 8 and a gate electrode 9 are formed on the surface of the nitride semiconductor stacked structure 6 (here, on the surface of the AlGaN electron supply layer 5).

The semiconductor device according to the present embodiment can be fabricated in such a manner as described above.

Accordingly, with the semiconductor device and the fabrication method according to the present embodiment, there is an advantage that, where the p-GaN back barrier layer 3 formed from p-GaN in which Mg is doped is provided, the entire p-GaN back barrier layer 3 can be activated with certainty.

It is to be noted that, while the present embodiment is described taking, as an example, the semiconductor device that includes the GaN channel layer 4 and the AlGaN electron supply layer 5 and in which the p-GaN back barrier layer 3 formed from p-GaN in which Mg is doped is provided, the invention is not limited to this. For example, the present invention can be applied also to any semiconductor device that includes a semiconductor stacked structure including an electron transit layer (channel layer) and an electron supply layer and in which a p-type back barrier layer formed from a p-type nitride semiconductor in which Mg or Zn is doped is provided, and an advantage is obtained that the entire p-type back barrier layer can be activated with certainty therewith.

In particular, the p-type nitride semiconductor for forming the p-GaN back barrier layer 3 is not limited to p-GaN, and, for example, $In_xAl_yGa_{(1-x-y)}N$ ($0 \leq x < 1$, $0 \leq y < 1$, $0 < x+y \leq 1$) may be used. At this time, it is preferable to use GaN or InGaN in that a higher effect can be obtained. Further, a material in which Mg is doped may not be used, and, for example, a material in which Zn is doped may be used.

Further, the nitride semiconductor stacked structure 6 including the electron channel layer 4 and the electron supply layer 5 is not limited to the nitride semiconductor stacked structure 6 including the GaN channel layer 4 and the AlGaN electron supply layer 5. For example, for the electron supply layer 5, $In_xAl_yGa_{(1-x-y)}N$ ($0 \leq x < 1$, $0 \leq y < 1$, $0 < x+y \leq 1$) can be used. At this time, it is preferable to use $Al_{0.2}Ga_{0.8}N$ or $In_{0.17}Al_{0.83}N$. Further, the nitride semiconductor stacked structure 6 may include a cap layer for which GaN or the like is used.

Further, while the element isolation region 11 in the embodiment described above is formed by ion implantation, the embodiment is not limited to this, and the element isolation region may be formed, for example, by dry etching. Here, where the element isolation region is formed by dry etching, the element isolation region becomes an etching region (element isolation groove). In this case, the groove 10 extending to the p-GaN back barrier layer 3 of the embodiment described above may function also as an element isolation groove. In particular, one groove may function as both of the groove for activating the p-GaN back barrier layer (etching region) and the groove for element isolation (etching region).

Further, while the groove 10 extending to the p-GaN back barrier layer 3 in the embodiment described above is provided in the element isolation region (inactive region) 11 in the proximity of the active region 12, the embodiment is not limited to this. For example, the groove extending to the p-GaN back barrier layer may be provided in the active region or in the proximity of the active region. This is because H in the p-type back barrier layer in the active region can be desorbed more efficiently as the groove extending to the p-type back barrier layer is provided at a position nearer to the active region.

Figure 3B:
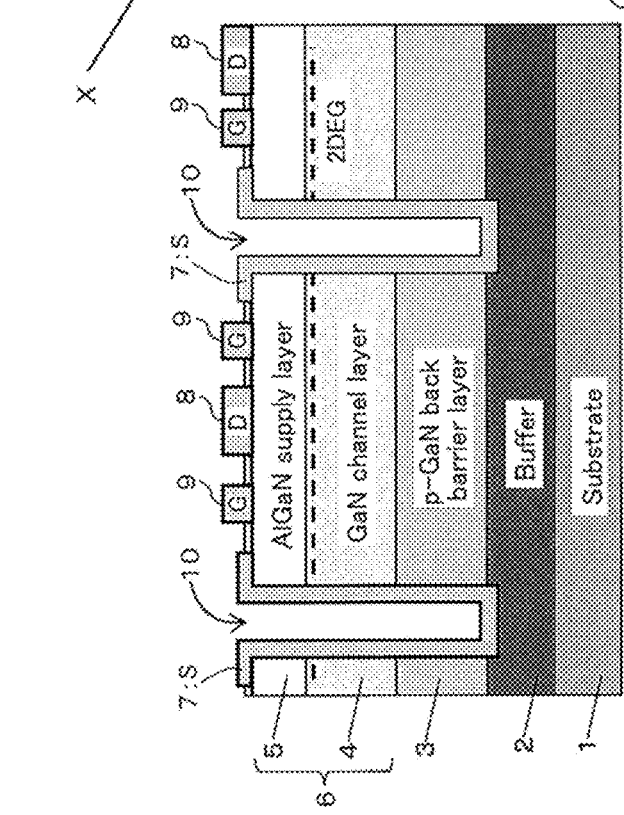
Figure 3A:
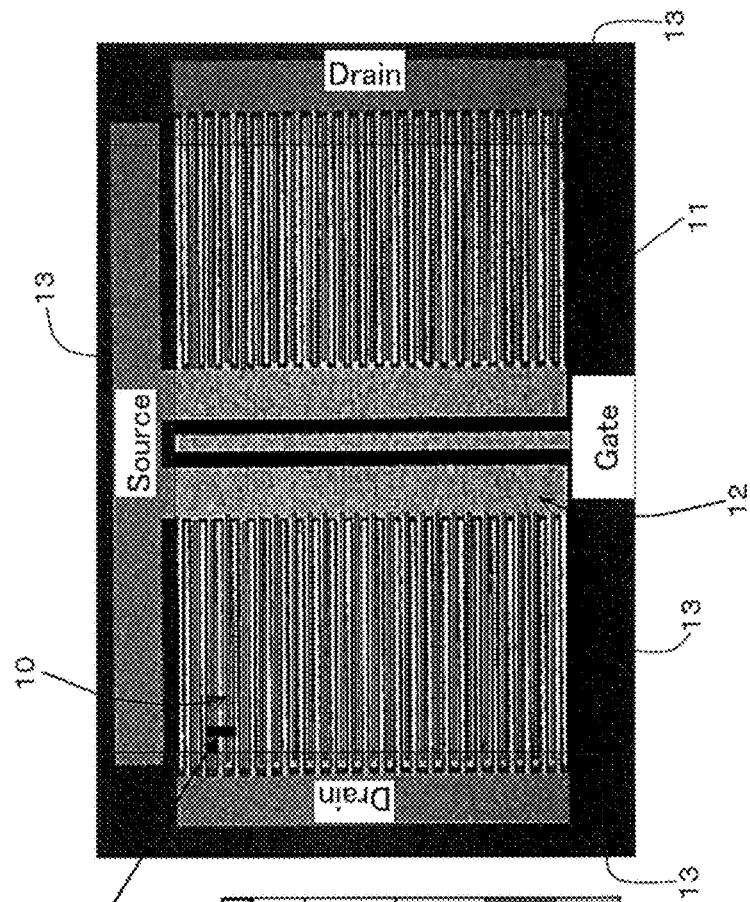

For example, as depicted in FIGS. 3A and 3B, where the peripheral region of the active region 12 is the inactive region (element isolation region) 11, the groove (etching region) 10 extending to the p-type back barrier layer 3 may be provided in the active region 12. In particular, where a plurality of source electrodes 7, drain electrodes 8 and gate electrodes 9 are provided in parallel to each other in the active region 12 and they are provided repetitively in order of the source electrode 7, drain electrode 8 and gate electrode 9, the groove 10 extending to the p-type back barrier layer 3 may be provided just under each of the source electrodes 7. In this case, the groove 10 extending to the p-type back barrier layer 3 is the groove 10 extending from the surface of the nitride semiconductor stacking structure 6 to the p-type back barrier layer 3. Further, the source electrodes 7 are provided over the grooves 10 extending to the p-type back barrier layer 3. This configuration is referred to as first modification. It is to be noted that FIG. 3A is a sectional view depicting, for example, a portion indicated by reference character X in FIG. 3B in an enlarged scale.

In this case, since the source electrodes 7 are provided on the surface of the grooves 10 and the grooves 10 extend to the p-type back barrier layer (here, p-GaN back barrier layer) 3, the source electrodes 7 contact with the p-type back barrier layer 3. Consequently, the potential of the p-type back barrier layer 3 can be made less likely to vary. Further, if a potential variation of the p-type back barrier layer 3 is caused by electrification to the trap level or the like, then the on resistance or a threshold value varies. However, by adopting such a structure as described above, the potential variation of the p-type back barrier layer 3 can be suppressed and stabilized operation can be implemented.

The semiconductor device according to the first modification can be fabricated in the following manner.

Figure 4B:
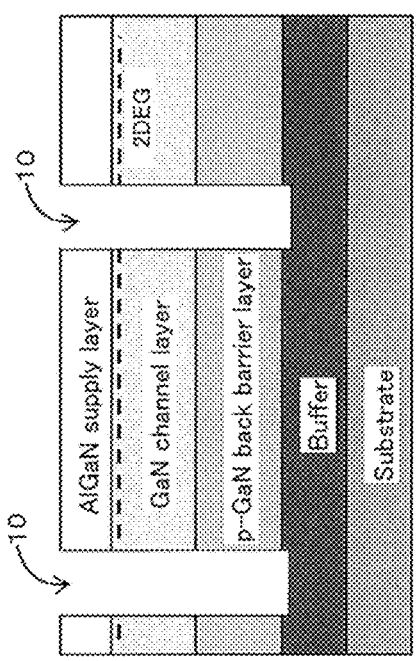
FIGS. 4A to 4D are schematic sectional views illustrating a fabrication method for a semiconductor device according to the first modification to the first embodiment.
Figure 4D:
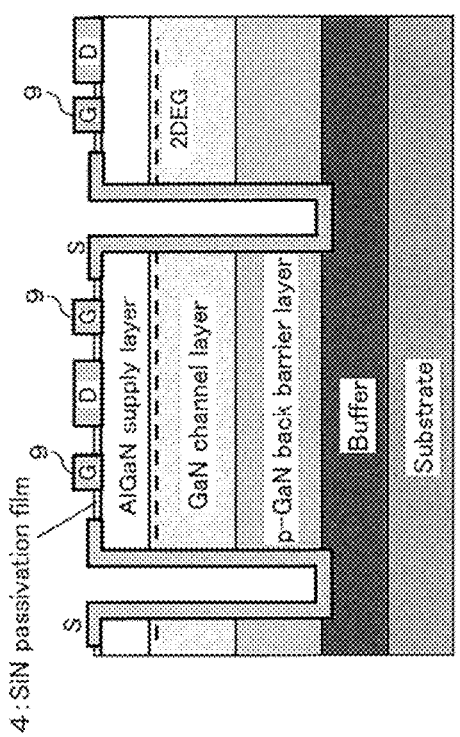
Figure 4A:
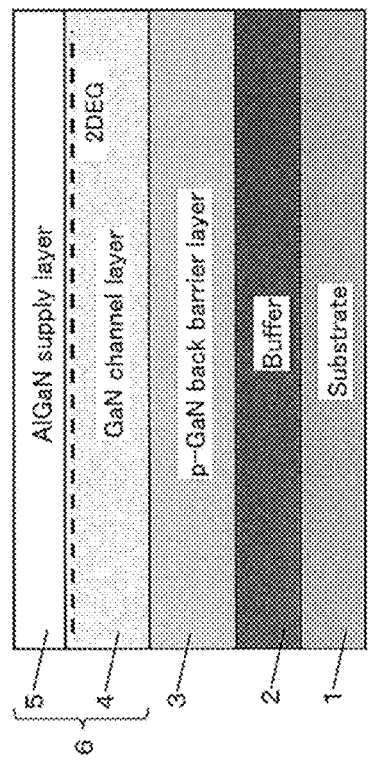

First, as depicted in FIG. 4A, an AlN nucleation layer as the buffer layer 2, a p-GaN back barrier layer 3, a GaN electron transit layer 4 and an AlGaN electron supply layer 5 (for example, $Al_{0.2}Ga_{0.8}N$ electron supply layer) are formed on a SiC substrate 1 similarly as in the embodiment described above. Consequently, the nitride semiconductor stacking structure 6 including the GaN channel layer 4 and the AlGaN electron supply layer 5 is formed over the p-GaN back barrier layer 3.

Then, an element isolation region 11 is formed by performing, for example, ion implantation of Ar so that the element isolation region 11 is formed around an active region 12 (refer to FIG. 3B). Here, the ion implantation of Ar for formation of the element isolation region 11 may be performed with energy of such a degree that ions reach the 2DEG region of the interface between the AlGaN electron supply layer 5 and the GaN channel layer 4.

Then, as depicted in FIG. 4B, a groove (etching region) 10 is formed at a location at which a source electrode is to be formed in the active region 12 so as to extend from the surface of the nitride semiconductor stacking structure 6, namely, from the surface of the AlGaN electron supply layer 5, to the p-GaN back barrier layer 3, for example, by etching using chlorine-based gas.

After the groove 10 extending to the p-GaN back barrier layer 3 is formed in such a manner as just described, as an activation anneal process for desorbing H from the p-GaN-back barrier layer 3 to activate the p-GaN back barrier layer 3, an anneal process is performed at approximately 750° C. for approximately 10 minutes, for example, in a nitrogen atmosphere. In this case, since the groove 10 extending to the p-GaN back barrier layer 3 is formed, H (hydrogen) can be desorbed from the p-GaN back barrier layer 3 through the groove 10. In particular, H (hydrogen) can be desorbed from the p-GaN back barrier layer 3 not only through the side wall of the wafer (refer to FIG. 3B) but also through the groove 10 provided in the active region 12 at the inner side than the side wall 13. Consequently, the entire p-GaN back barrier layer 3 can be activated with certainty also including a location spaced far from the side wall 13 of the wafer (for example, a central portion of the wafer; a central portion of the active region 12). Then, by the p-GaN back barrier layer 3 provided under the GaN channel layer 4 and activated entirely, leak current flowing between the source electrode 7 and the drain electrode 8 can be suppressed also where the gate length is short.

Figure 4C:
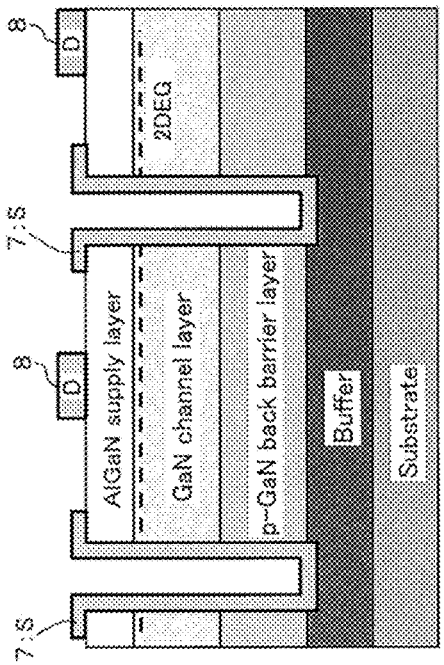

Then, as depicted in FIG. 4C, a source electrode 7 and a drain electrode 8 are formed. Here, the source electrode 7 is formed on the groove 10 extending to the p-GaN back barrier layer 3, namely, on the groove 10 used for desorption of H from the p-GaN back barrier layer 3, so as to extend from the surface of the nitride semiconductor stacking structure 6 (here, the surface of the AlGaN electron supply layer 5) to the bottom of the groove 10 and cover the surface of the groove 10. In other words, the source electrode 7 is formed over the groove 10 extending to the p-GaN back barrier layer 3. Further, the drain electrode 8 is formed on the surface of the nitride semiconductor stacking structure 6 (here, the surface of the AlGaN electron supply layer 5).

Thereafter, as depicted in FIG. 4D, a SiN film having a thickness of, for example, approximately 50 nm is formed as the passivation film 14 for covering the surface, for example, by a CVD method.

Finally, the gate electrode 9 is formed after the SiN film 14 at a location at which the gate electrode is to be formed is removed by etching, for example, using fluorine-based gas.

The semiconductor device according to the first modification can be fabricated in this manner.

It is to be noted that, while the groove (etching region) 10 extending to the p-type back barrier layer 3 in the first modification is provided just under the source electrode 7, the embodiment is not limited to this. For example, the groove (etching region) 10 extending to the p-type back barrier layer 3 may be provided just under the drain electrode 8 or the groove (etching region) 10 extending to the p-type back barrier layer 3 maybe provided just under the source electrode 7 and the drain electrode 8. In this case, the source electrode 7 or the drain electrode 8 are provided over the groove 10 extending to the p-type back barrier layer 3.

Further, while the groove 10 extending to the p-type back barrier layer 3 in the embodiment described above is the groove 10 extending from the surface of the nitride semiconductor stacking structure 6 to the p-type back barrier layer 3, the embodiment is not limited to this.

Figure 5:
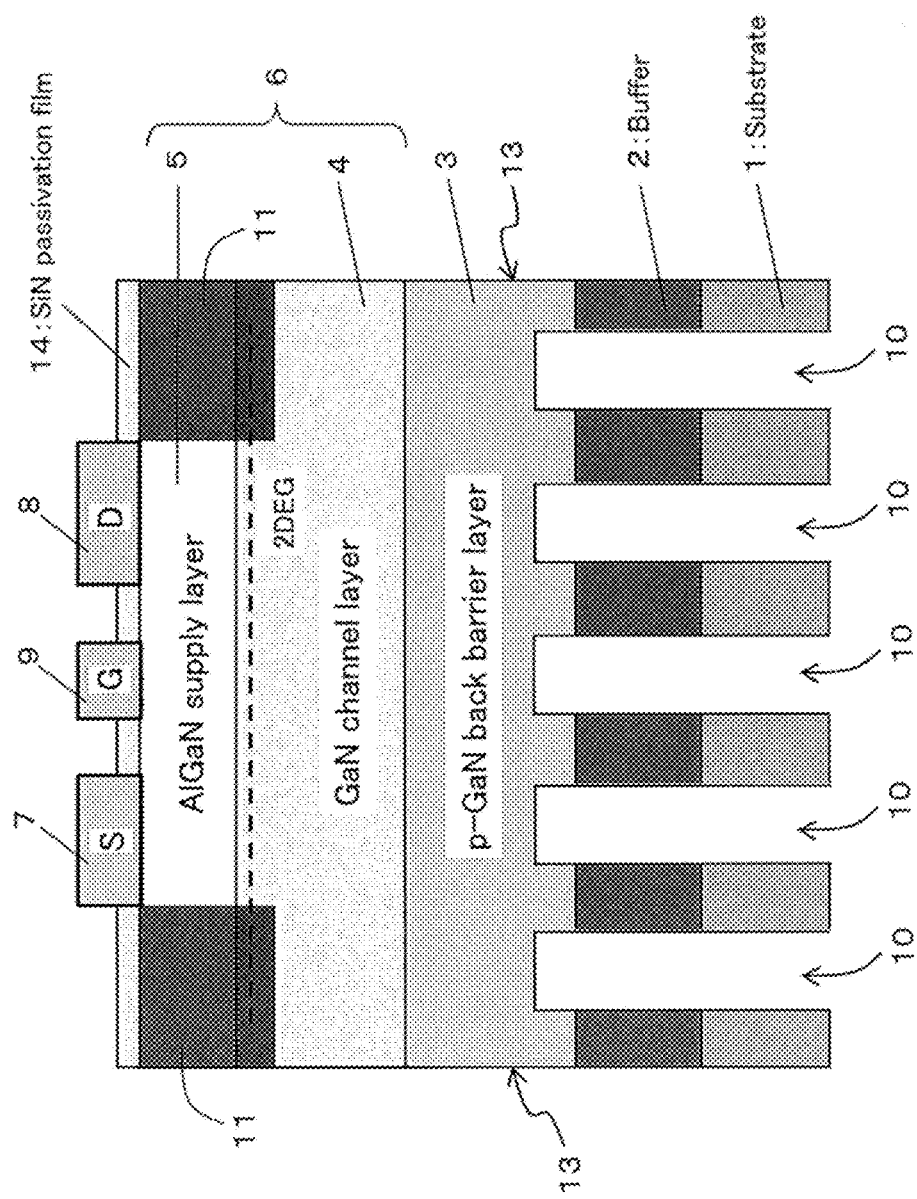
FIG. 5 is a schematic sectional view depicting a configuration of a semiconductor device according to a second modification to the first embodiment.

For example, as depicted in FIG. 5, the groove 10 extending to the p-type back barrier layer 3 may be a groove (etching region) 10 extending from the back face of the substrate 1 to the p-type back barrier layer 3. By this, the heat radiation area can be provided wide and the heat radiation effect can be enhanced. This is referred to as second modification.

The semiconductor device according to the second modification can be fabricated in the following manner.

Figure 6B:
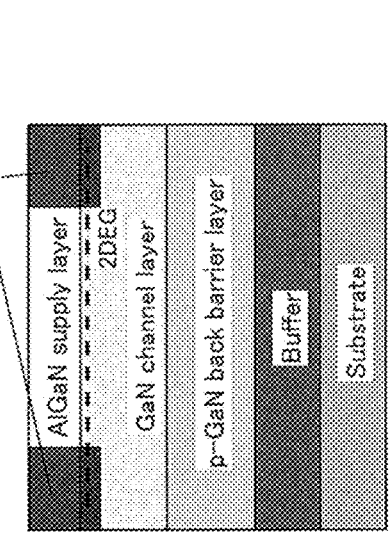
FIGS. 6A to 6D are schematic sectional views illustrating a fabrication method for a semiconductor device according to the second modification to the first embodiment.
Figure 6D:
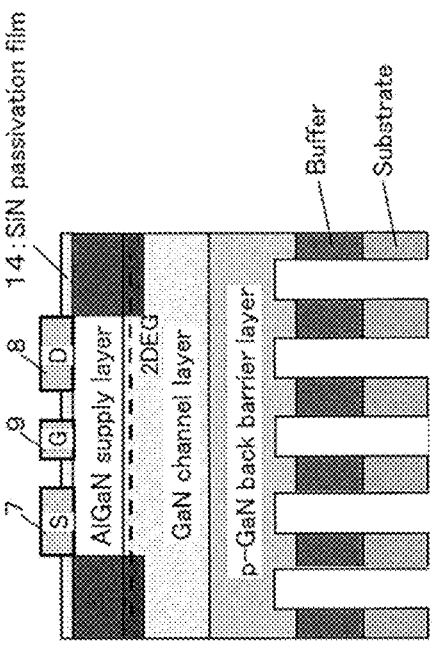
Figure 6A:
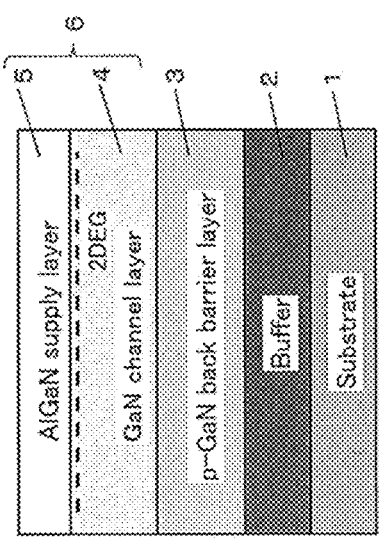

First, as depicted in FIG. 6A, an AlN nucleation layer as the buffer layer 2, a p-GaN back barrier layer 3, a GaN electron transit layer 4 and an AlGaN electron supply layer 5 (for example, $Al_{0.2}Ga_{0.8}N$ electron supply layer) are formed on a SiC substrate 1 similarly as in the embodiment described above. Consequently, a nitride semiconductor stacking structure 6 including the GaN channel layer 4 and the AlGaN electron supply layer 5 is formed over the p-GaN back barrier layer 3.

Then, as depicted in FIG. 6B, an element isolation region 11 is formed by ion implantation of, for example, Ar similarly as in the embodiment described above.

Figure 6C:
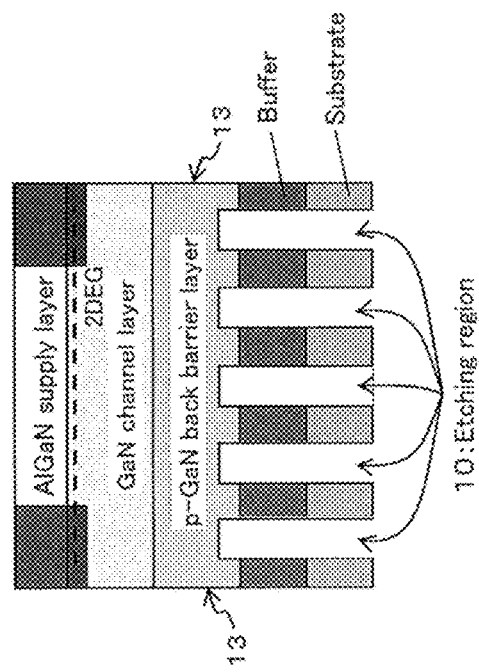

Then, as depicted in FIG. 6C, by etching using, for example, inactive gas or chlorine-based gas, a groove (etching region) 10 is formed so as to extend from the back face of the substrate 1 to the p-GaN back barrier layer 3.

After the groove 10 extending to the p-GaN back barrier layer 3 is formed in such a manner as just described, as an activation anneal process for desorbing H from the p-GaN-back barrier layer 3 to activate the p-GaN back barrier layer 3, an anneal process is performed at approximately 750° C.

for approximately 10 minutes, for example, in a nitrogen atmosphere. In this case, since the groove 10 extending to the p-GaN back barrier layer 3 is formed, H (hydrogen) can be desorbed from the p-GaN back barrier layer 3 through the groove 10. In particular, H (hydrogen) can be desorbed from the p-GaN back barrier layer 3 not only through the side wall of the wafer (refer to FIG. 3B) but also through the groove 10 provided at the inner side than the side wall 13. Consequently, the entire p-GaN back barrier layer 3 can be activated with certainty also including a location spaced far from the side wall 13 of the wafer without performing a complicated process. Then, by the p-GaN back barrier layer 3 provided under the GaN channel layer 4 and activated entirely, leak current flowing between the source electrode 7 and the drain electrode 8 can be suppressed also where the gate length is short.

Thereafter, as depicted in FIG. 6D, a SiN film having a thickness of, for example, approximately 50 nm is formed as the passivation film 14 for covering the surface, for example, by a CVD method.

Finally, after the SiN film 14 at a location at which the electrodes are to be formed is removed by etching, for example, using fluorine-based gas, a source electrode 7, a drain electrode 8 and a gate electrode 9 are formed on the surface of the nitride semiconductor stacking structure 6 (here, on the surface of the AlGaN electron supply layer 5).

The semiconductor device according to the second embodiment can be fabricated in such a manner as described above.

Further, while the anneal process for desorbing hydrogen from the p-type back barrier layer 3 through the groove 10 extending to the p-GaN back barrier layer 3 to activate the p-type back barrier layer 3 is performed in the embodiment described above, the embodiment is not limited to this.

Figure 7:
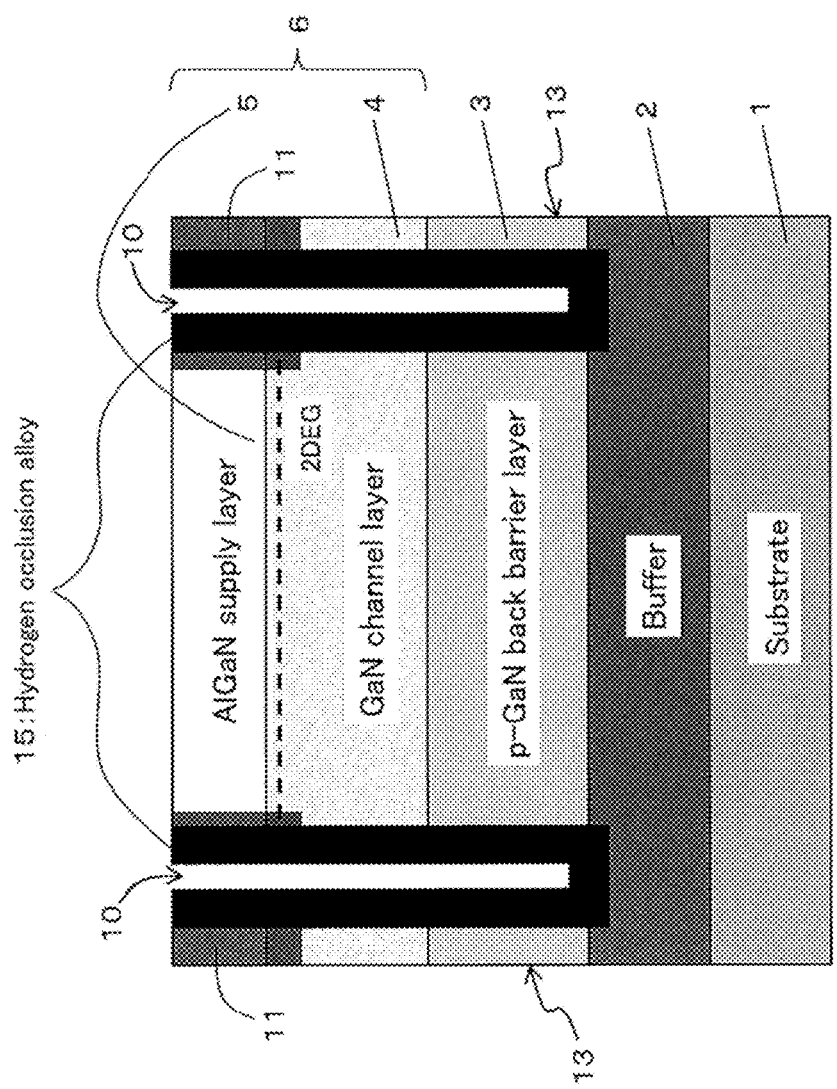
FIG. 7 is a schematic sectional view illustrating a fabrication method for a semiconductor device according to a third modification to the first embodiment.

For example, before the anneal process is performed as depicted in FIG. 7 after the groove 10 extending to the p-GaN back barrier layer 3 is formed, the hydrogen occlusion alloy 15 may be provided on the groove 10 extending to the p-GaN back barrier layer 3, and at the step of performing the anneal process, hydrogen may be desorbed from the p-type back barrier layer 3 using the groove 10 extending to the p-GaN back barrier layer 3 and the hydrogen occlusion alloy 15 provided on the groove 10 to activate the p-type back barrier layer 3. In other words, the activation anneal of the p-GaN back barrier layer 3 may be accelerated using the hydrogen occlusion alloy 15. In this case, it is preferable for the hydrogen occlusion alloy 15 to include any one of Ti, Zr, Pd and Mg. This is referred to as third modification.

The semiconductor device according to the third modification can be fabricated in the following manner.

Figure 8A:
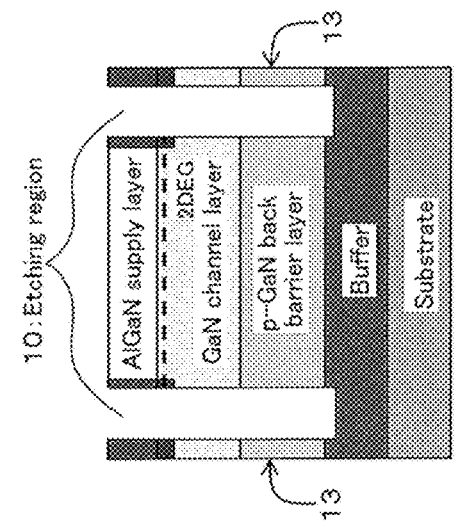
FIGS. 8A to 8E are schematic sectional views illustrating a fabrication method for a semiconductor device according to the third modification to the first embodiment.

First, as depicted in FIG. 8A, an AlN nucleation layer as the buffer layer 2, a p-GaN back barrier layer 3, a GaN electron transit layer 4 and an AlGaN electron supply layer 5 (for example, $Al_{0.2}Ga_{0.8}N$ electron supply layer) are formed on a SiC substrate 1 similarly as in the embodiment described above. Consequently, a nitride semiconductor stacking structure 6 including the GaN channel layer 4 and the AlGaN electron supply layer 5 is formed over the p-GaN back barrier layer 3.

Figure 8B:
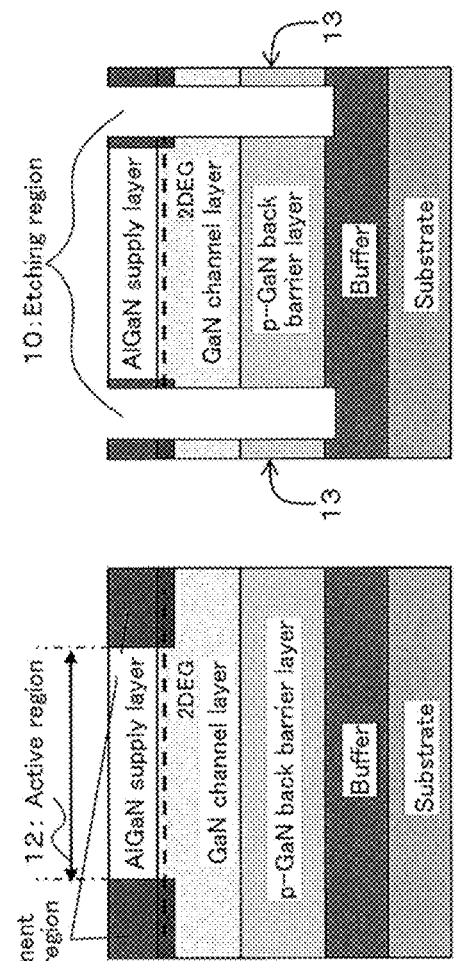

Then, as depicted in FIG. 8B, an element isolation region 11 is formed by ion implantation of, for example, Ar similarly as in the embodiment described above.

Figure 8C:
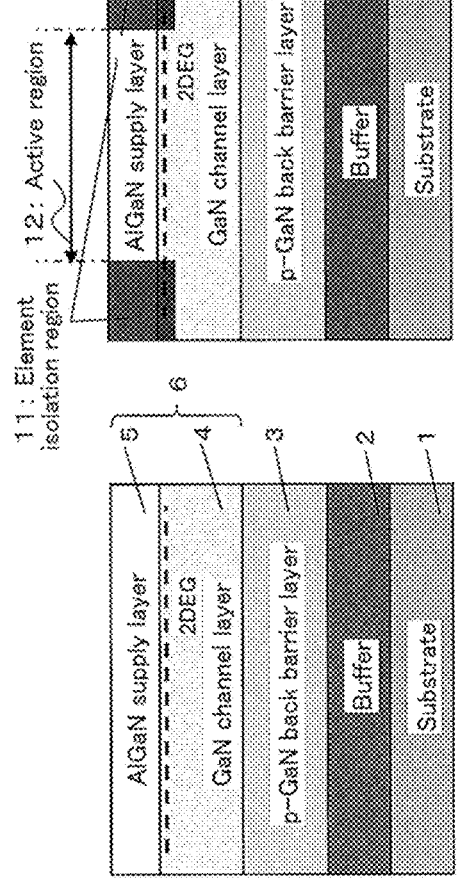

Then, as depicted in FIG. 8C, by etching using, for example, chlorine-based gas, a groove (etching region) 10 is formed in the element isolation region 11 in the proximity of the active region 12 so as to extend from the surface of the nitride semiconductor stacked structure 6, namely, from the surface of the AlGaN electron supply layer 5, to the p-GaN back barrier layer 3.

Figure 8D:
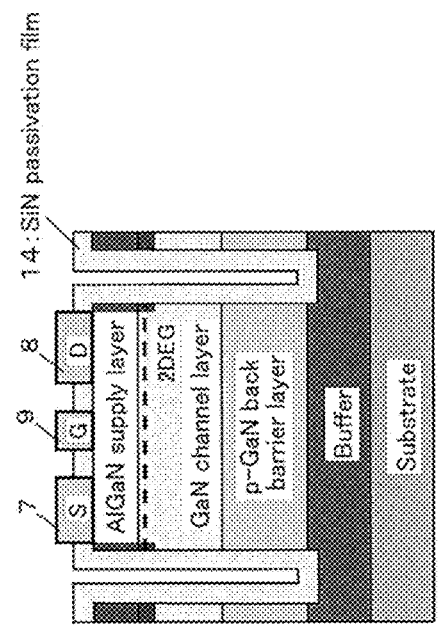

Then, as depicted in FIG. 8D, Ti that is the hydrogen occlusion alloy 15 is deposited on the groove 10 extending to the p-GaN back barrier layer 3.

After Ti that is the hydrogen occlusion alloy 15 is deposited on the groove 10 extending to the p-GaN back barrier layer 3 in this manner, as the activation anneal process for desorbing H from the p-GaN back barrier layer 3 to activate the p-GaN back barrier layer 3, an anneal process is performed at approximately 750° C. for approximately 10 minutes, for example, in a nitrogen atmosphere. In this case, since the groove 10 extending to the p-GaN back barrier layer 3 is formed and the hydrogen occlusion alloy 15 is provided on the groove 10, H (hydrogen) can be desorbed from the p-GaN back barrier layer 3 using the groove 10 and the hydrogen occlusion alloy 15. In particular, H (hydrogen) can be desorbed from the p-GaN back barrier layer 3 using not only the side wall 13 of the wafer but also the groove 10 provided at the inner side than the side wall 13. Consequently, the entire p-GaN back barrier layer 3 can be activated with certainty also including a location spaced far from the side wall 13 of the wafer. Further, since Ti that functions as the hydrogen occlusion alloy 15 exists in the groove 10, desorption of H from the p-GaN back barrier layer 3 can be accelerated and the activation efficiency of the p-GaN back barrier layer 3 can be enhanced. Then, by the p-GaN back barrier layer 3 provided under the GaN channel layer 4 and activated entirely so that the activation efficiency is further enhanced, leak current flowing between the source electrode 7 and the drain electrode 8 can be suppressed also where the gate length is short.

Ti that is the hydrogen occlusion alloy 15 is removed, for example, by fluoric acid after the activation anneal process is performed in such a manner as described above.

Figure 8E:
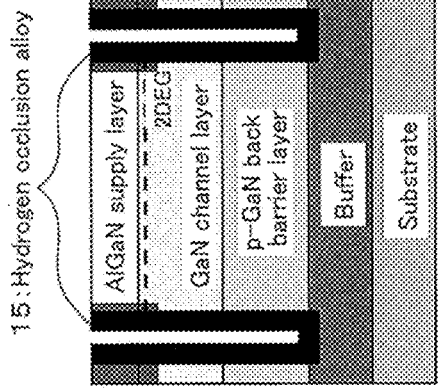

Thereafter, as depicted in FIG. 8E, similarly as in the embodiment described above, a SiN film having a thickness of, for example, approximately 50 nm is formed as the passivation film 14 for covering the surface, for example, by a CVD method.

Finally, similarly as in the embodiment described above, after the SiN film 14 at a location at which the electrodes are to be formed is removed by etching, for example, using fluorine-based gas, a source electrode 7, a drain electrode 8 and a gate electrode 9 are formed on the surface of the nitride semiconductor stacking structure 6 (here, the surface of the AlGaN electron supply layer 5).

The semiconductor device according to the third modification can be fabricated in such a manner as described above.

It is to be noted that, while the third modification is described as a modification to the embodiment described above, the present modification can be applied also to the other modifications such as the first modification and the second modification described above.

Second Embodiment

Now, a semiconductor device, a fabrication method for a semiconductor device and a power supply apparatus according to a second embodiment are described with reference to FIGS. 12 and 13.

The semiconductor device according to the present embodiment is a semiconductor package including, as a semiconductor chip, a semiconductor device (AlGaN/GaN-HEMT) according to any one of the first embodiment and the modifications described above. It is to be noted that the semiconductor chip is referred to also as HEMT chip or transistor chip.

The second embodiment is described below taking a discrete package as an example.

Figure 12:
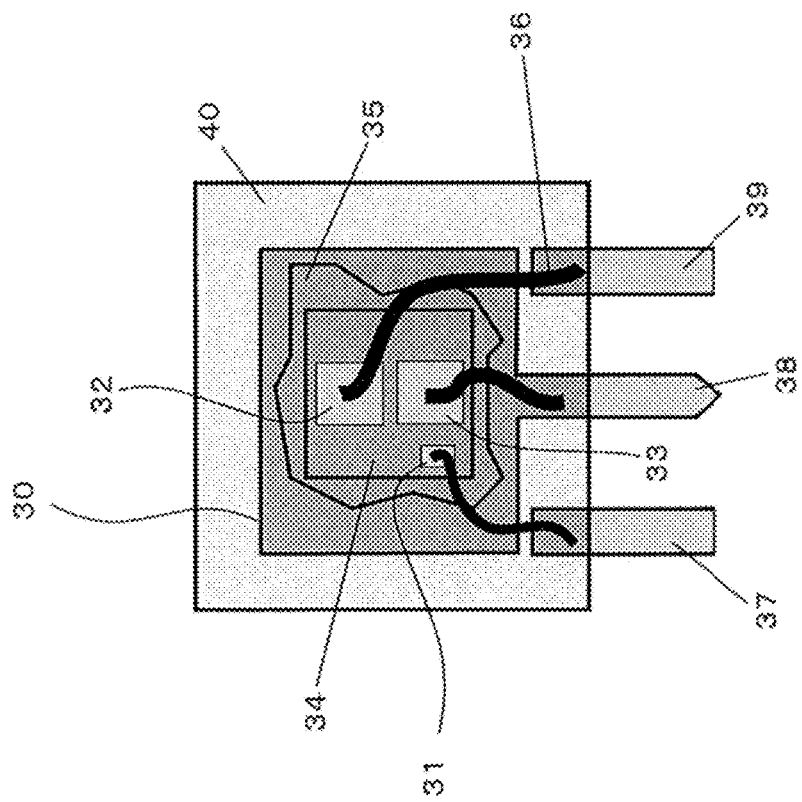
FIG. 12 is a schematic top plan view depicting a configuration of a semiconductor device (semiconductor package) according to a second embodiment.

As depicted in FIG. 12, the present semiconductor device includes a stage 30 on which a semiconductor chip according to one of the first embodiment and the modifications described above therein is mounted, a gate lead 37, a source lead 39, a drain lead 38, bonding wires 36 (here, Al wires) and an encapsulation resin 40. It is to be noted that the encapsulation resin is referred to sometimes as a molding resin.

A gate pad 31, a source pad 32 and a drain pad 33 of the semiconductor chip 34 mounted on the stage 30 are coupled with the gate lead 37, source lead 39 and drain lead 38, respectively, by the Al wires 36, which then undergoes resin encapsulation.

Here, the stage 30 to which the back face of the substrate of the semiconductor chip 34 is fixed by die attach material 35 (here, solder) is coupled electrically with the drain lead 38. It is to be noted that the embodiment is not limited to this, and the stage 30 may be coupled electrically with the source lead 39.

Now, a fabrication method for a semiconductor device (discrete package) according to the present embodiment is described.

First, a semiconductor chip 34 (AlGaN/GaN-HEMT) according to one of the first embodiment and the modifications described above is fixed to the stage 30 of a lead frame using, for example, die attach material 35 (here, solder).

Then, by bonding using, for example, Al wires 36, the gate pad 31, drain pad 33 and source pad 32 of the semiconductor chip 34 are coupled with the gate lead 37, drain lead 38 and source lead 39, respectively.

Thereafter, the lead frame is separated after resin encapsulation is performed, for example, by a transfer mold method.

The semiconductor device (discrete package) can be fabricated in this manner.

It is to be noted that, while the embodiment here is described taking, as an example, the discrete package in which the pads 31 to 33 of the semiconductor chip 34 are used as bonding pads for wire bonding, the embodiment is not limited to this and some other semiconductor package maybe used. For example, a semiconductor package may be used in which pads of a semiconductor chip are used as bonding pads for wireless bonding such as, for example, flip chip bonding. Further, a wafer level package may be used. Further, a semiconductor package other than a discrete package may be used.

Now, a power supply apparatus that includes a semiconductor package including an AlGaN/GaN-HEMT described above is described with reference to FIG. 13.

The power supply apparatus is described below taking, as an example, a case in which an AlGaN/GaN-HEMT included in a semiconductor package described above is used for a PFC (power factor correction) circuit provided in a power supply apparatus used for a server.

Figure 13:
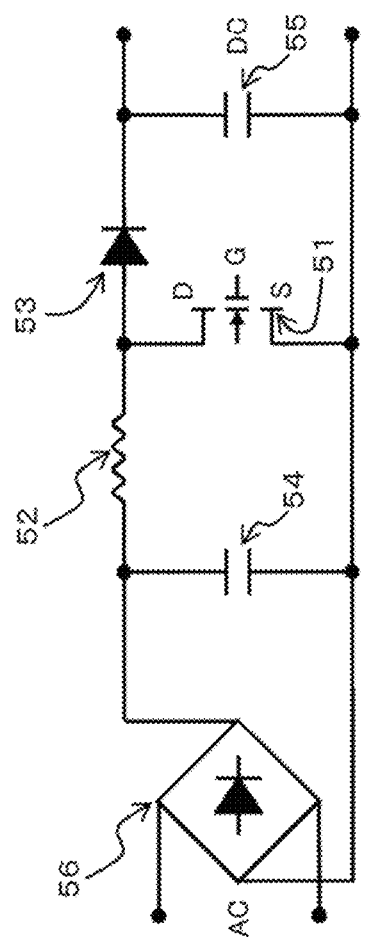
FIG. 13 is a schematic view depicting a configuration of a PFC circuit included in a power supply apparatus according to the second embodiment.

As depicted in FIG. 13, the present PFC circuit includes a diode bridge 56, a choke coil 52, a first capacitor 54, an AlGaN/GaN-HEMT 51 included in the semiconductor package described above, a diode 53 and a second capacitor 55.

Here, the present PFC circuit is configured by mounting the diode bridge 56, choke coil 52, first capacitor 54, transistor 51 included in the semiconductor package described above, diode 53 and second capacitor 55 on a circuit board.

In the present embodiment, the drain lead 38, source lead 39 and gate lead 37 of the semiconductor package described above are inserted in a drain lead insertion portion, a source lead insertion portion and a gate lead insertion portion of the circuit board, respectively, and are fixed, for example, by solder or the like. The transistor 51 included in the semiconductor package described above is coupled with the PFC circuit formed on the circuit board in this manner.

Further, in the present PFC circuit, one of terminals of the choke coil 52 and an anode terminal of the diode 53 are connected to a drain electrode D of the AlGaN/GaN-HEM 51. Further, one of terminals of the first capacitor 54 is connected to the other one of the terminals of the choke coil 52, and one of terminals of the second capacitor 55 is connected to a cathode terminal of the diode 53. Further, the other one of the terminal of the first capacitor 54, a source electrode S of the AlGaN/GaN-HEMT 51 and the other one of the terminals of the second capacitor 55 are grounded. Further, a pair of terminals of the diode bridge 56 are connected to the opposite terminals of the first capacitor 54, and an input terminal to which an alternating current (AC) voltage is inputted is connected to a different pair of terminals of the diode bridge 56. Further, the opposite terminals of the second capacitor 55 are connected to output terminals from which a direct current (DC) voltage is outputted. A gate driver not depicted is connected to a gate electrode G of the AlGaN/GaN-HEMT 51. In the present PFC circuit, by driving the AlGaN/GaN-HEMT 51 by the gate driver, an AC voltage inputted from the input terminal is converted into a DC voltage and then outputted from the output terminals.

Accordingly, with the power supply apparatus according to the present embodiment, there is an advantage that the reliability can be enhanced. In particular, there is an advantage that, since the semiconductor chip 34 according to any one of the first embodiment and the modifications described above is provided, a power supply apparatus having high reliability can be constructed.

It is to be noted that, while the embodiment is described here taking, as an example, a case in which the semiconductor device described hereinabove (AlGaN/GaN-HEMT or a semiconductor package including the AlGaN/GaN-HEMT) is used for the PFC circuit provided in the power supply apparatus to be used for a server, the embodiment is not limited to this. For example, the semiconductor device described above (AlGaN/GaN-HEMT or a semiconductor package including the AlGaN/GaN-HEMT) may be used for electronic equipment (electronic apparatus) such as a computer other than a server. Further, the semiconductor device described above (semiconductor package) may be used for other circuits (for example, a DC-DC converter or the like) provided in a power supply apparatus.

Third Embodiment

Now, a high-frequency amplifier according to a third embodiment is described with reference to FIG. 14.

The high-frequency amplifier according to the present embodiment is a high-frequency amplifier (high-output power amplifier) including a semiconductor device according to any one of the first embodiment and the modifications described above.

Figure 14:
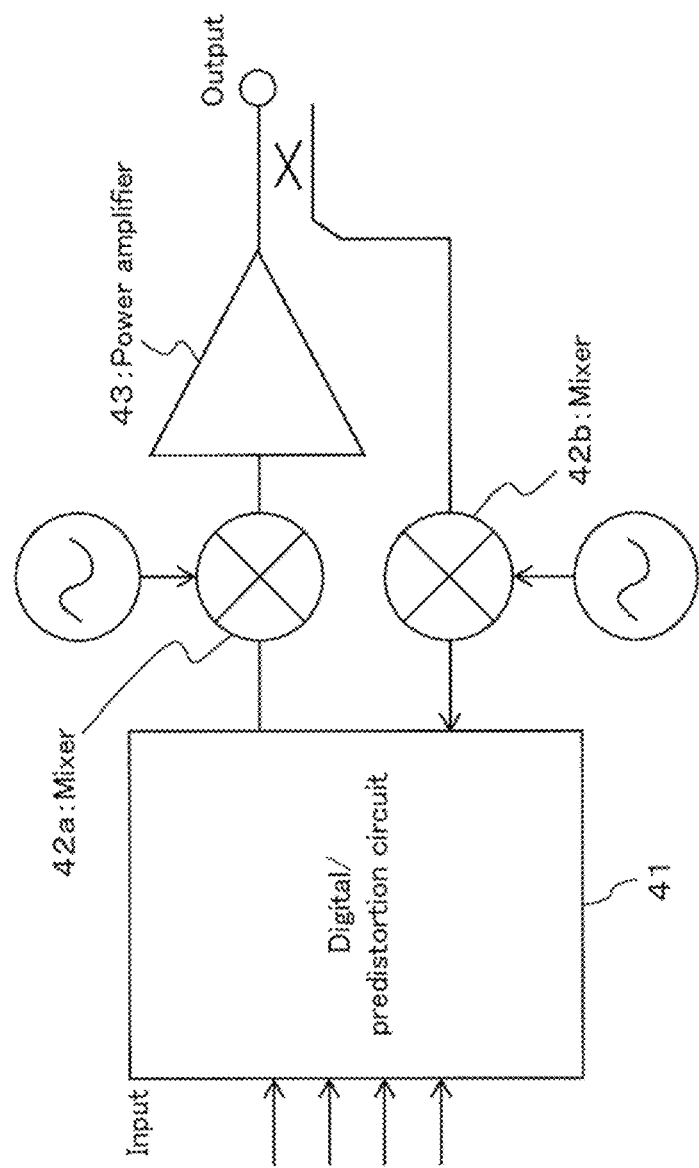
FIG. 14 is a schematic view depicting a configuration of a high-frequency amplifier according to a third embodiment.

As depicted in FIG. 14, the present high-frequency amplifier includes a digital pre-distortion circuit 41, mixers 42a and 42*b* and a power amplifier 43. It is to be noted that the power amplifier is referred to sometimes simply as amplifier.

The digital pre-distortion circuit 41 compensates for a non-linear distortion of an input signal.

The mixers 42*a* and 42*b* perform mixing of the input signal whose non-linear distortion is compensated for and an alternating current signal.

The power amplifier 43 amplifies the input signal after mixing with the alternating current signal and includes a semiconductor device according to any one of the first embodiment and the modifications described above, namely, a semiconductor chip including an AlGaN/GaN-HEMT. It is to be noted that the semiconductor chip is referred to sometimes as HEMT chip or transistor chip.

It is to be noted that a configuration is depicted in FIG. 14 in which, for example, by changeover of a switch, a signal at the output side can be mixed with an alternating current signal by the mixer 42*b* and sent out to the digital pre-distortion circuit 41.

Accordingly, with the high-frequency amplifier according to the present embodiment, there is an advantage that, since the semiconductor device according to anyone of the first embodiment and the modifications described above is applied to the power amplifier 43, a high-frequency amplifier having high reliability can be implemented.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A fabrication method for a semiconductor device, comprising:

forming a p-type back barrier layer from a p-type nitride semiconductor in which Mg or Zn is doped over a substrate;

forming a nitride semiconductor stacked structure including an electron transit layer and an electron supply layer over the p-type back barrier layer;

forming a source electrode, a drain electrode and a gate electrode over the nitride semiconductor stacked structure;

forming a groove extending to the p-type back barrier layer; and performing an anneal process for desorbing hydrogen from the p-type back barrier layer through the groove to activate the p-type back barrier layer.

2. The fabrication method for a semiconductor device according to claim 1, further comprising providing a hydrogen occlusion alloy in the groove before the anneal process is performed after the groove is formed; wherein in the performing the anneal process, hydrogen is desorbed from the p-type back barrier layer using the groove and the hydrogen occlusion alloy formed in the groove to activate the hydrogen occlusion alloy.

3. The fabrication method for a semiconductor device according to claim 2, wherein the hydrogen occlusion alloy contains any one of Ti, Zr, Pd and Mg.

4. The fabrication method for a semiconductor device according to claim 1, wherein, in the forming the groove, the groove is formed so as to extend from the surface of the nitride semiconductor stacked structure to the p-type back barrier layer.

5. The fabrication method for a semiconductor device according to claim 1, wherein, in the forming the groove, the groove is formed in an active region or in the proximity of the active region.

6. The fabrication method for a semiconductor device according to claim 1, wherein, in the forming the source electrode, drain electrode and gate electrode, the source electrode or the drain electrode is formed over the groove.

7. The fabrication method for a semiconductor device according to claim 1, wherein, in the forming the groove, the groove is formed so as to extend from the back face of the substrate to the p-type back barrier layer.

\* \* \* \* \*